United States Patent [19]

Maskery

[11] 4,019,123
[45] Apr. 19, 1977

[54] MAGNETIC AMPLIFIER ARRANGEMENTS
[75] Inventor: Arthur Maskery, London, England
[73] Assignee: Westinghouse Brake and Signal Co. Ltd., England
[22] Filed: Sept. 18, 1973
[21] Appl. No.: 398,430
[52] U.S. Cl. .............................. 323/85; 323/89 C; 323/89 P
[51] Int. Cl.² .......................................... G05F 1/32
[58] Field of Search ............ 323/50, 85, 89 C, 89 P
[56] References Cited
UNITED STATES PATENTS

| | | | |
|---|---|---|---|
| 2,870,397 | 1/1959 | Kelley | 323/89 C |
| 3,296,492 | 1/1967 | Drozdov et al. | 323/89 P |
| 3,430,025 | 2/1969 | Livshits et al. | 323/89 C |

*Primary Examiner*—A. D. Pellinen
*Attorney, Agent, or Firm*—Larson, Taylor and Hinds

[57] ABSTRACT

A magnetic amplifier is disclosed which has improved fail-safe characteristics, the amplifier has a pair of saturable magnetizable cores with d.c. control winding turns on each which are mutually decoupled in known manner with regard to input a.c. windings and the a.c. windings also have linked with them a further magnetizable core, the output from the transductor being derived from a secondary winding on the further cores. The arrangement enables various applications of a magnetic amplifier to be made which might otherwise be objectionable by reason of the reduced operational failure-to-safety characteristics. These applications include use in a brake control circuit.

2 Claims, 6 Drawing Figures

MAGNETIC AMPLIFIER ARRANGEMENTS

This invention relates to magnetic amplifier arrangements. According to the present invention there is provided a magnetic amplifier arrangement which includes first and second magnetisable flux paths having wound thereabout respective a.c. excitation windings which are mutually decoupled with respect to d.c. control winding means also linked with the flux paths and wherein said excitation windings are each wound also about a third flux path linking a secondary winding for providing the amplifier a.c. output and in which third path mutually counteracting fluxes are induced in the event of a shorted excitation winding.

Figure 1:
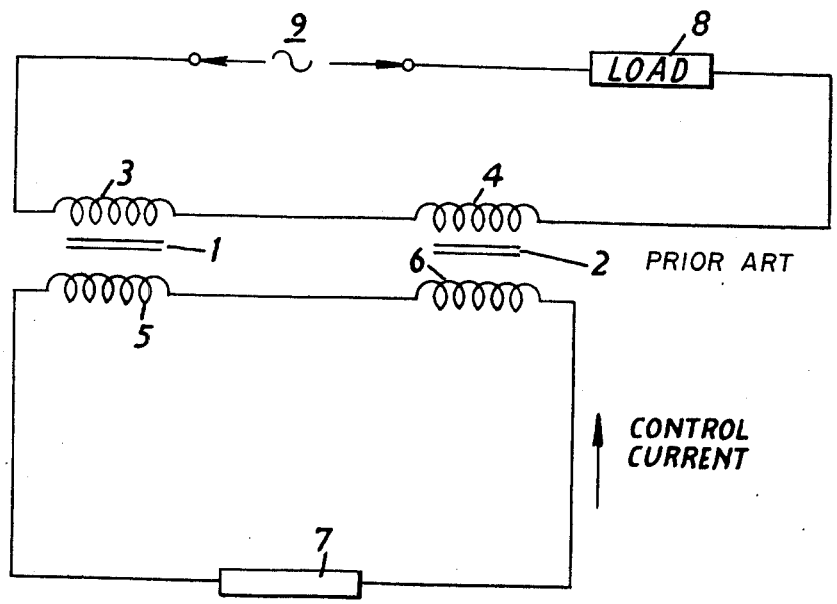
Figure 2:
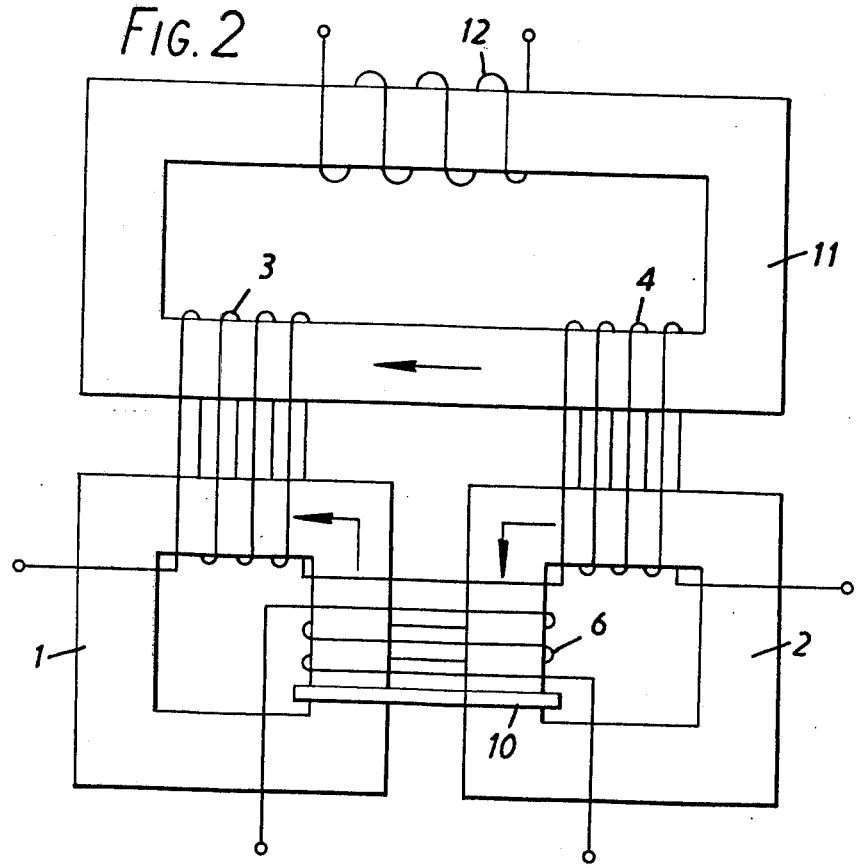
Figure 3:
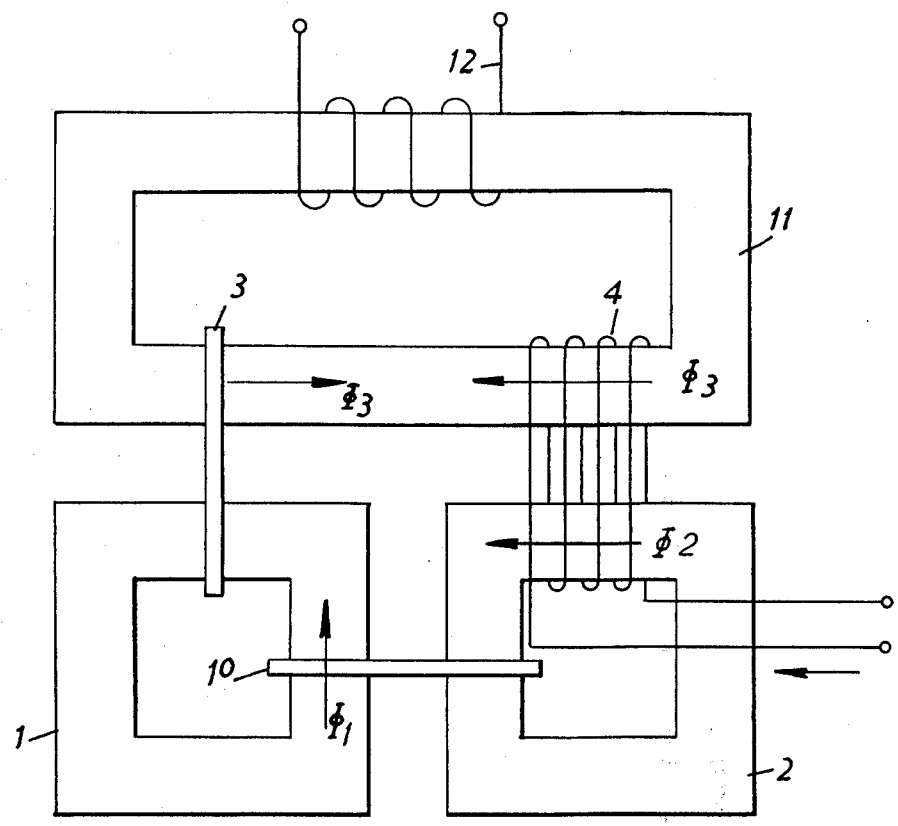
Figure 4:
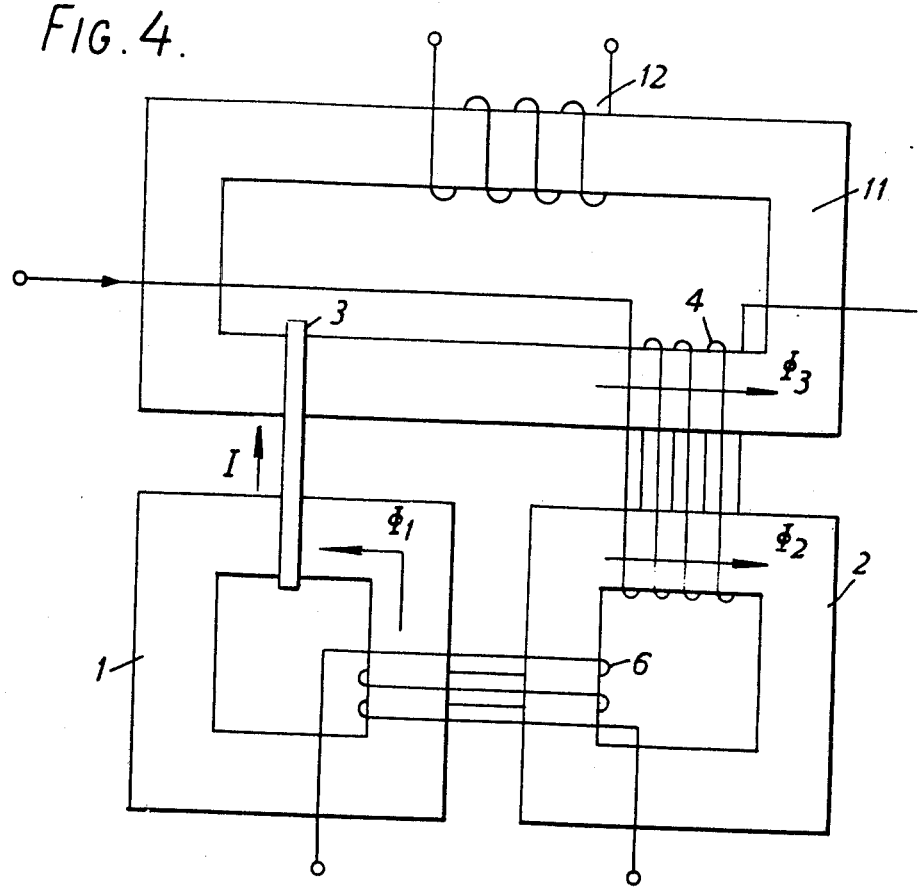
Figure 5:
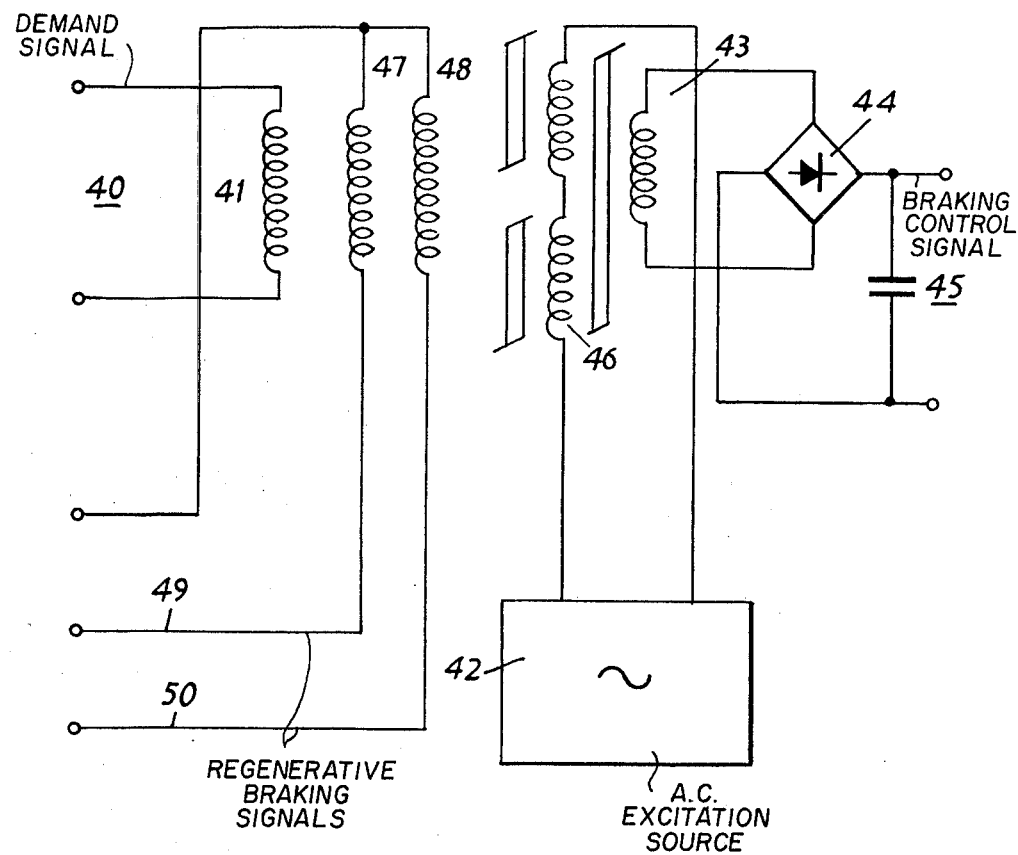
Figure 6:
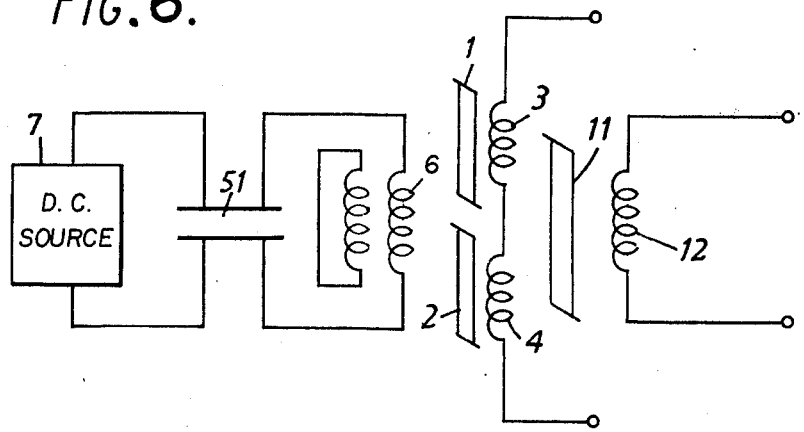

In order that the invention may be more clearly understood and readily carried into effect, the same will be further described with reference to the accompanying drawings of which FIG. 1 illustrates a prior art magnetic amplifier arrangement, FIG. 2 illustrates in diagrammatical form, a magnetic amplifier in accordance with one embodiment of the invention, and FIGS. 3 and 4 illustrate equivalent circuit arrangements under fault conditions, FIG. 5 shows a modification of a magnetic amplifier according to the invention for multicar train brake blending and FIG. 6 shows a modification of a circuit using a magnetic amplifier according to the invention.

Referring now to FIG. 1 the known form of magnetic amplifier arrangement shown diagrammatically therein consists of a pair of magnetisable cores 1 and 2 on which a.c. windings 3 and 4 are wound such as to be mutually decoupled with respect to a d.c. control circuit having windings 5 and 6 respectively on the cores. It is common practice moreover to combine the windings 5 and 6 into a single winding linked with both cores. The control winding or windings are fed with a variable d.c. signal from a source 7 and depending upon the value of the signal the output current to a load 8 from an a.c. excitation source 9 is determined. The arrangement operates by output voltage extraction whilst saturation of alternate cores is being overcome in successive half cycles, the respective core and its windings operating on the transformer principle of ampere-turns equality from the point of view of the output current supplied to the load 8.

A magnetic amplifier such as the above may not be a completely fail-safe device at least in as much as under fault condition, it can produce an appreciable output with no control current from the source 7. Specifically, if one or the other of the a.c. windings, i.e., 3 on core 1 or winding 4 on core 2 is short-circuited or has shorted turns, the winding on the the other core is obliged to support the full a.c. voltage of the excitation source. If the impedance of the d.c. source circuit is high there is negligible output but if the latter impedance is low, an appreciable current may flow in the a.c. windings, due to transformer action permitting induced current in the d.c. winding. In other words, the mutual decoupling as between the d.c. and a.c. circuits is upset by a short circuited winding and can result in a non fail-safe or wrong side failure.

Referring to FIG. 2, the magnetic amplifier arrangement shown therein by way of example in accordance with the invention again comprises a pair of magnetisable cores 1 and 2, providing the flux paths with which the respective a.c. windings 3 and 4 are linked. Further, the d.c. windings are now embraced in well known manner in a single winding denoted by the reference 6, together with an added shorted turn denoted by the reference 10. The purpose of this shorted turn will be appreciated hereinafter. In addition to being linked to the respective cores 1 and 2, the a.c. excitation windings 3 and 4 of the magnetic amplifier arrangement are also linked to a third core 11 which provides the flux path in a transformer which has a secondary winding 12 for providing the a.c. output of the magnetic amplifier.

Referring now to FIG. 3, this illustrates again in diagrammatical form the equivalent circuit arrangement of the magnetic amplifier of FIG. 2 assuming that due to a fault the winding 3 has a shorted turn or shorted turns. The shorted turn 10 is deliberately provided as in FIG. 2.

FIG. 4 shows a further equivalent circuit arrangement of the magnetic amplifier of FIG. 2 in which due to a fault the winding 3 has a shorted turn or shorted turns but in which the deliberately included shorted turn of the arrangement of FIG. 2 has now been excluded.

Referring now to the operation of the magnetic amplifier arrangement of FIG. 2, it will again be understood that the senses of the windings 3 and 4 are such that mutual decoupling is effective as between them and the d.c. winding 6 and the shorted turn 10. It will be recalled that this is in accord with the known arrangement described above with reference to FIG. 1. With an a.c. excitation voltage applied to the primary windings 3 and 4 of the transformer having core 11 and with no d.c. control current, if the secondary winding 12 is in an open-circuit condition, the flux which links the series connected windings 3 and 4 to support the excitation a.c. voltage is distributed between the three cores 1, 2 and 11. This distribution in this case is inversely proportional to the natural relative reluctances of the cores. If a load is now connected to the winding 12, the output current is again relatively low since the effect of the current in the load is to increase the reluctance of the core 11 and redistribute the major part of the total flux into the cores 1 and 2. If now a d.c. control current is assumed to be applied from the d.c. source (not shown) to the winding 6, the effect of this control current in any given half cycle of the excitation a.c. supply, is to saturate one of the cores. If in one half cycle the saturated core is core 1, core 2 when driven unsaturated behaves as a transformer the primary current rising to a value which establishes ampere turns equality between the winding 4 and the control winding 6. The opposite is clearly true in the next half cycle when the core 2 becomes the saturated core and an ampere turns equality relationship exists between the winding 6 and the winding 3.

Assuming that the secondary winding 12 of the transformer is on open circuit, the core 11 has a low reluctance and only a small increase in current occurs in the windings 3 and 4 since this small increase produces flux in the core 11 which links with the two windings 3 and 4 to produce a back electromotive force which supports the excitation voltage applied to them. The output voltage from the winding 12 under open circuit conditions with a d.c. control signal on the winding 6 is therefore relatively high. If moreover a load is connected to the winding 12 and in the limit is a short circuit the reluctance of the core 11 increases to such an extent as to again force a redistribution of the major part of the flux into (say) the core 2. The current in the windings 3 and 4 therefore increase in order to establish ampere turns equality between the winding 4 and the d.c. control winding 6. The current in the windings 3 and 4 therefore applies a magnetomotive force to the core 11 and in order to reduce the flux in the core 11 to zero, the magnetomotive force in the winding 12 is required to equal that in the winding 3 and 4. Again, the ampere-turns equality relationship exists.

With the cores 1 and 2 saturated, the transformer core 11 operates in normal transformer fashion and the effective turns ratio is that of the totality of windings 3 and 4 to the number of turns on the secondary winding 12.

Referring now to FIG. 3, and assuming that the winding 3 is subject to a short circuit under a fault condition, the excitation voltage is now applied only to the winding 4. The induced fluxes as a result of this excitation applied to the winding 4 alone are as shown. The flux 2 induced in the core 2 induces a corresponding current in the deliberate short circuit 10 which links the cores 1 and 2. This produces a flux 1 in the core 1 and a flux 3 in the core 11 as a result of the presence of the non-deliberate short circuit provided by 3 and which links cores 1 and 11. The arrangement of fluxes in the cores is such that they are all in opposition and there is therefore negligible output from the secondary winding 12. In other words the secondary winding 12 is unable to support any voltage and in the absence of precautions to the contrary the current from the excitation source may rise to a dangerous level but never-the-less substantially no output is produced by the winding 12.

It will be recalled that the above mutually cancelling arrange-ment of fluxes, resulted in part from the presence of the deliberate short-circuited turn 10 provided linked with cores 1 and 2. Assuming now that the deliberately inserted short-circuit winding 10 is not included, reference may be had to FIG. 4. In this schematic drawing, the system is such that again the excitation voltage is supported by the winding 4. A current I is induced as a result thereof in the shorted turn provided by the failure in winding 3 and this in turn induces a flux 1 in the core 1 which is in phase with the flux induced by the excitation current in the winding 4 in the core 2. This induces a voltage in the control winding 6. If a load is connected to the secondary winding 12 of the transformer, the increase in the reluctance of the core 11 which results again causes a redistribution of the major part of the flux into the core 2 and the output current is low. If the control winding 6 is connected to a low impedance source, the conditions are the same as those which exist for a deliberate short circuit as provided previously by the inclusion of the shorted turn 10. If however the winding 6 is connected to a control source which contains non-linear elements, the induced voltage which results in the winding 6 may produce a d.c. component in the control winding which increases the reluctance of the core 2 and asserts some influence on the distribution of flux as between cores 2 and 11 such as to produce a failure-mode output in the winding 12. For such conditions, the shorted turn as provided by the winding 10 may therefore be essential.

When the current gain of such a magnetic amplifier is high the control winding consequently has a large number of turns. It may be difficult in practice to provide a shorted turn around cores 1 and 2 which will reduce the induced voltage in the control winding to a sufficiently low level to prevent the setting up of a d.c. component in the control winding, when the control circuit contains non-linear elements. In such cases the induced voltage can be removed by means of a capacitor 51 placed across the control winding as shown in FIG. 6 to form an R.C. filter in conjunction with the winding resistance. The other references employed in FIG. 6 correspond to those used previously in FIGS. 1 to 4 and will not be described further. The capacitor may preferably be of the four terminal type. Thus if the capacitor should fail to an open circuit state, the control winding is disconnected from the non linear source. The shorted turn can be retained in order to reduce the ripple current handled by the capacitor.

In an example of an application of a magnetic amplifier in accordance with the invention, reference may be had to a fail-safe brake blending system which typically may be employed on a three car train. In such a system the braking may again be provided by electric braking means and also additional friction braking means. Again, the efficiency in the electric or regenerative braking is compensated for by desired amount of friction braking force applied to each car. By way of example, a single blending unit may be employed to provide the control of the braking on all of the cars. It is therefore important that the one blending unit shall have an acceptable failure mode.

Referring to FIG. 5, this shows the essentials of the system as far as the magnetic amplifier itself is concerned. The demand signal from a drivers brake control device is applied at the terminals 40 to the control winding 41 of the magnetic amplifier. The magnetic amplifier is energised by an a.c. excitation source denoted by the block 42. The system is operated in an energise-to-release mode so that with the drivers brake signal on the winding 41 demanding release of the brakes, current in the winding 41 is a maximum. This produces a maximum output from the secondary winding 43 via a rectifier bridge 44 to train wires 45 supplying the braking control on all the cars of the train. A demand for braking is thus effected by reducing the current in the winding 41. The regenerative or electric braking is monitored by means of magnetic amplifiers and assuming that two of the cars of the train have motors, these motors produce signals in lines 49 and 50 to the two additional control windings 47 and 48 of the magnetic amplifier. In this way, the two regenerative brake signals are summed and subtracted from the demand signal to produce the desired braking control signal on the train lines 45.

Many other applications of a fail-safe magnetic amplifier in accordance with the invention will become apparent to persons skilled in the art.

Having thus described our invention what we claim is:

1. Electropneumatic braking control apparatus comprising a magnetic amplifier arrangement including a first magnetizable core, a second magnetizable core and a third magnetizable core, a first full-wave a.c. input winding wound about the first core and the third core, a second full-wave a.c. winding equivalent to the first winding and wound about the second core and the third core, common d.c. control winding means wound about the first and second cores with the sense thereof relative to the first and second windings being such that fluxes normally linked with the d.c. winding means, due to alternating current in the a.c. windings, mutually cancel, and a secondary winding being provided on the third core for producing an output from the magnetic amplifier arrangement, means for applying a signal to said d.c. control winding means which is the resultant of a demand signal and an opposed regenerative braking signal, and means connected to the output of said secondary winding on said third core for producing a control signal for controlling an electropneumatic brake, said arrangement including a common short circuited winding about the first and second cores.

2. Electropneumatic braking control apparatus comprising a magnetic amplifier arrangement including a first magnetizable core, a second magnetizable core and a third magnetizable core, a first full-wave a.c. input winding wound about the first core and the third core, a second full-wave a.c. winding equivalent to the first winding and wound about the second core and the third core, common d.c. control winding means wound about the first and second cores with the sense thereof relative to the first and second windings being such that fluxes normally linked with the d.c. winding means due to alternating current in the a.c. windings, mutually cancel, and a secondary winding being provided on the third core for producing an output from the magnetic amplifier arrangement, means for applying a signal to said d.c. control winding means which is the resultant of a demand signal and an opposed regenerative braking signal, and means connected to the output of said secondary winding on said third core for producing a control signal for controlling an electropneumatic brake, said arrangement including a capacitor connected across the d.c. control winding.

* * * * *